(12) United States Patent
Khuc

(10) Patent No.: US 9,991,435 B2
(45) Date of Patent: Jun. 5, 2018

(54) DEVICE FOR EXHAUST GAS HEAT UTILIZATION, EXHAUST GAS MODULE HAVING SUCH A DEVICE, AND METHOD OF MANUFACTURING THE DEVICE

(75) Inventor: Anh-Duy Khuc, Ulm (DE)

(73) Assignee: FAURECIA EMISSIONS CONTROL TECHNOLOGIES, GERMANY GMBH, Augsburg (DE)

( * ) Notice: Subject to any disclaimer, the term of this patent is extended or adjusted under 35 U.S.C. 154(b) by 109 days.

(21) Appl. No.: 13/596,155

(22) Filed: Aug. 28, 2012

(65) Prior Publication Data

US 2013/0206200 A1 Aug. 15, 2013

(30) Foreign Application Priority Data

Aug. 30, 2011 (DE) .......................... 10 2011 111 954

(51) Int. Cl.
*H01L 35/30* (2006.01)
*F01N 5/02* (2006.01)
*H01L 35/34* (2006.01)

(52) U.S. Cl.
CPC ............. *H01L 35/30* (2013.01); *F01N 5/025* (2013.01); *H01L 35/34* (2013.01); *F01N 2410/00* (2013.01); *F01N 2410/02* (2013.01); *Y02T 10/16* (2013.01); *Y10T 29/49826* (2015.01)

(58) Field of Classification Search
CPC ......... H01L 35/30; H01L 35/32; H01L 35/34; F01N 5/025; F01N 2240/02
USPC .................................................. 136/205, 212
See application file for complete search history.

(56) References Cited

U.S. PATENT DOCUMENTS

| | | | | |
|---|---|---|---|---|
| 3,006,979 A | * | 10/1961 | Rich | H01L 35/30 136/204 |
| 5,226,298 A | * | 7/1993 | Yamamoto et al. | 62/3.4 |
| 5,465,578 A | * | 11/1995 | Barben et al. | 62/3.2 |
| 5,968,456 A | | 10/1999 | Parise | |
| 2004/0031514 A1 | * | 2/2004 | Bell | 136/203 |
| 2006/0118159 A1 | * | 6/2006 | Tsuneoka | H01L 35/04 136/211 |
| 2006/0157102 A1 | * | 7/2006 | Nakajima et al. | 136/205 |
| 2008/0173342 A1 | * | 7/2008 | Bell | F02G 1/043 136/201 |
| 2009/0139556 A1 | * | 6/2009 | Bell et al. | 136/201 |
| 2009/0301541 A1 | * | 12/2009 | Watts | F24J 2/42 136/205 |
| 2010/0186422 A1 | * | 7/2010 | Yang | H01L 35/30 62/3.3 |

(Continued)

FOREIGN PATENT DOCUMENTS

DE 102007063171 A1 6/2009
DE 102008043346 A1 5/2010
(Continued)

*Primary Examiner* — Angelo Trivisonno
(74) *Attorney, Agent, or Firm* — Carlson, Gaskey & Olds, P.C.

(57) ABSTRACT

A device for exhaust gas heat utilization in internal combustion engines of motor vehicles has an outer housing through which exhaust gas can flow and at least one thermoelectric generator module received in the outer housing. The at least one thermoelectric generator module is fastened onto a wavelike carrier wall. The invention further relates to an exhaust gas module having such a device, and to a method of manufacturing this device.

21 Claims, 2 Drawing Sheets

(56) References Cited

U.S. PATENT DOCUMENTS

| | | | |
|---|---|---|---|
| 2011/0126530 A1* | 6/2011 | Callahan | F01N 5/025 60/320 |
| 2012/0012146 A1* | 1/2012 | Salzgeber | F01N 5/025 136/205 |
| 2012/0024334 A1* | 2/2012 | Amanze | 136/212 |

FOREIGN PATENT DOCUMENTS

| | | | |
|---|---|---|---|
| DE | 102009025033 A1 | 12/2010 | |
| EP | 2320486 A2 | 5/2011 | |
| WO | WO 2010112571 A2 * | 10/2010 | F01N 5/025 |

* cited by examiner

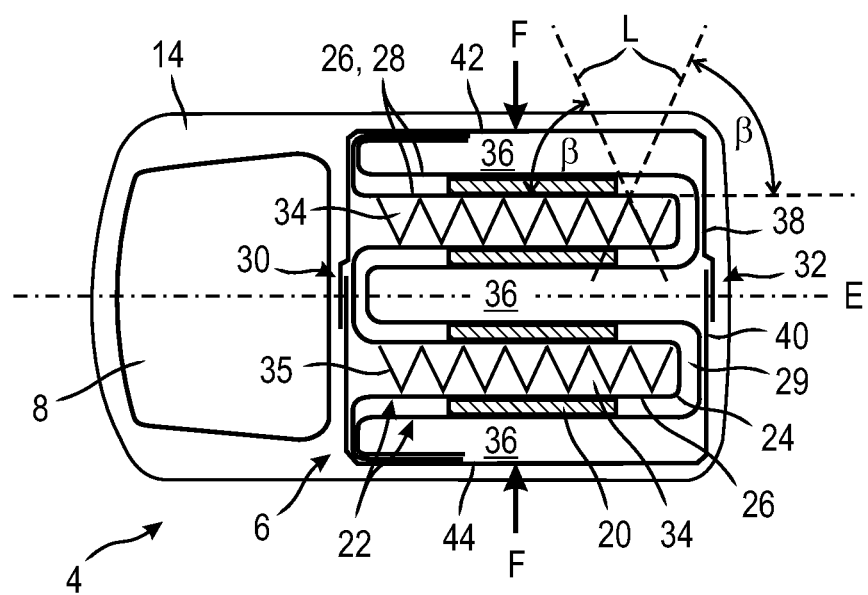

DEVICE FOR EXHAUST GAS HEAT UTILIZATION, EXHAUST GAS MODULE HAVING SUCH A DEVICE, AND METHOD OF MANUFACTURING THE DEVICE

CROSS-REFERENCE TO RELATED APPLICATION

This application claims priority to German Patent Application No. 10 2011 111 954.3, filed Aug. 30, 2011.

TECHNICAL FIELD

The invention relates to a device for exhaust gas heat utilization in internal combustion engines, to an exhaust gas module for motor vehicles having such a device, and to a method of manufacturing this device.

BACKGROUND OF THE INVENTION

Within the context of the global climate discussion, the rules concerning the energy efficiency and $CO_2$ emissions of internal combustion engines have already been tightened, and in the future, even stricter regulations are to be expected. This is why increased efforts have been made for some time to use the exhaust gas heat of internal combustion engines, possibly during the entire engine operation, and preferably to convert it into electric energy. With this electric energy, it is then, for example, possible to charge accumulators or to operate electric devices. So-called "thermoelectric generator modules" (referred to as TEG modules below) which convert thermal energy into electric energy, and which can be used in exhaust systems, are already described in the prior art.

Such a device for exhaust gas heat utilization by means of TEG modules is for example disclosed in document DE 10 2009 025 033 A1. Furthermore, the common structure and the general operating principle of TEG modules are already sufficiently known from this document and from several further publications in the prior art, such that they are not discussed in more detail.

A great challenge in TEG modules is the efficient transfer of heat, i.e. a transfer of heat which loses as little heat as possible between the heat source, for example the hot exhaust gas, or the heat sink, for example a cooling agent, and the thermoelectrically active materials of the TEG module. The TEG module is delimited both on the "hot side" and on the "cold side" by a respective cover layer which is made of ceramics, for example, and adjoins an exhaust gas line or a cooling agent line. To realize a constantly high heat transmission between the cover layers and the exhaust gas line or the cooling agent line, the involved assemblies are compressed under high pressure and are then braced.

There is a need to provide a device for exhaust gas heat utilization in internal combustion engines, the design of which ensures with low manufacturing expenditure a lasting good transfer of heat, and thus a high overall efficiency of the device.

SUMMARY OF THE INVENTION

A device for exhaust gas heat utilization in internal combustion engines, in particular of motor vehicles, has an outer housing through which exhaust gas can flow and at least one thermoelectric generator module is received in the outer housing. The at least one thermoelectric generator module is fastened onto a wavelike carrier wall.

Due to the waveform of the carrier wall, TEG modules and the carrier wall can be braced with little effort, for example by a simple closing and assembling of the outer housing. Accordingly, a good transfer of heat is reached between the thermoelectrically effective materials of the TEG module and the hot exhaust gas or the cooling agent. The fastening of the TEG module onto the wavelike carrier wall is realized by bonding or soldering, for example.

The outer housing has a housing cross-section, with the carrier wall extending in a wavelike manner and in one piece from one cross-sectional edge to an opposite cross-sectional edge in one embodiment of the device for exhaust gas heat utilization. The carrier wall thus adjoins the cross-sectional edge, wherein the wall is adapted to contact the cross-sectional edge or to be spaced apart from the cross-sectional edge. In some variant embodiments, the carrier wall is even connected, in particular soldered or welded, to the cross-sectional edge.

The wavelike carrier wall preferably has a V-shaped wave cross-section or a U-shaped wave cross-section. Such cross-sections can be manufactured with low expenditure and permit a simple fastening of the TEG modules. Alternatively, wavelike carrier walls having a substantially sinusoidal wave cross-section are however also conceivable.

In one example, the wavelike carrier wall comprises bent wall portions and flat wall portions, with the at least one thermoelectric generator module being configured as a thin, cuboidal plate and to rest over an area against one of the flat wall portions. Conventional TEG modules comprise individual interconnected thermoelectric cells which are each delimited by a ceramic plate on a so-called "hot side" and on an opposite so-called "cold side". In this design, the TEG module is thus an inflexible cuboidal plate which can simply be brought into contact over an area with flat wall portions. If in contrast the thermoelectric generator modules have some flexibility, carrier walls having a sinusoidal wave cross-section are then also conceivable, onto which the thermoelectric generator modules are fastened over an area as curved plates.

Adjacent flat wall portions of the wavelike carrier wall can be oriented at an angle of $0°\leq\alpha\leq120°$, preferably of $45°\leq\alpha\leq90°$ with respect to each other. This angular range permits a high overall efficiency at a low space requirement of the device for exhaust gas heat utilization.

In a further embodiment, heat conducting lamellas adjoin the carrier wall on a face of the wavelike carrier wall facing away from the thermoelectric generator module, in particular wherein the lamellas are clamped between two wavelike carrier walls.

The lamellas can be connected, in particular can be soldered, to at least one of the adjoining carrier walls by an intermaterial bond.

In this embodiment, the lamellas are preferably made of a metal sheet bent in a concertina-like manner. This permits an inexpensive manufacture of the lamellas and a simple mounting of the lamellas in the device for exhaust gas heat utilization. The metal sheet thickness of the lamella is preferably between 0.1 mm and 0.5 mm.

In this embodiment, the wavelike carrier wall can furthermore comprise flat wall portions, and each lamella can determine a lamella plane, the lamella planes of the lamellas adjoining a flat wall portion preferably each forming an angle of $30°<\beta<90°$, and particularly preferably an angle of $60°<\beta<88°$ with the flat wall portion. In this case, the lamellas do not only improve the heat conduction of the carrier wall, but can also transmit a contact pressure perpendicularly to the flat wall portion, such that a good bracing is achieved between the TEG module and the carrier wall.

The at least one thermoelectric generator module is preferably held between two wavelike carrier walls. The carrier walls arranged on both sides of the generator module can in particular be two identical, stable metal sheets. Alternatively, only one carrier wall made of a stable metal sheet adjoins the TEG module, whereas on the opposite side, a flexible metal foil without inherent stiffness is provided. The ratio of the metal sheet thickness to the foil thickness is at least 10:1, preferably at least 25:1.

According to a further embodiment of the device for exhaust gas heat utilization, at least one flow channel for hot exhaust gas and at least one flow channel for a cooling agents extend through the outer housing, the at least one thermoelectric generator module being associated on opposite sides on the one hand with the exhaust gas and, on the other hand, with the cooling agent. The flow channels preferably extend parallel to each other, the exhaust gas and the cooling agent being adapted to flow through the flow channels in the same direction (parallel flow operation) or in opposite directions (counter flow operation) during operation of the device. As both the flow channel for hot exhaust gas and the flow channel for cooling agent are arranged within the outer housing, this can be referred to as a "closed system". This means in particular that the outer housing is cooled "from the interior" and no cooling by ambient air or similar is necessary. The cooling agent is preferably water from the engine cooling circuit. Alternatively, the device for exhaust gas heat utilization can however also have an own cooling circuit or can be connected to the cooling circuit of the air conditioning system.

In a further embodiment, the wavelike carrier wall, specifically the face of the carrier wall facing away from the thermoelectric generator module, is part of a flow channel for the hot exhaust gas or cooling agent, and/or the wavelike carrier wall defines along with the housing a flow channel for the exhaust gas. The transfer of heat between the exhaust gas or the cooling agent on the one hand, and the thermoelectric materials on the other hand, is particularly good in this case, as solely the carrier wall and the ceramic cover plate, for example, of the TEG module which rests over an area against the carrier wall must be overcome. To further increase this heat transfer, it is also possible to provide an additional intermediate layer between the carrier wall and the cover plate, for example a heat conducting film or a heat conducting paste.

In particular, two adjacent wavelike carrier walls can define a flow channel, in particular for exhaust gas, preferably to form a flow channel having a wavelike cross-section.

In a further embodiment of the device for exhaust gas heat utilization, the outer housing is composed of two pieces and has a parting plane at which two half shells are connected with each other to form the outer housing. To this end, the two half shells, are for example, fitted into each other and then welded or soldered together.

The two half shells are preferably acted upon by a joining force substantially oriented perpendicularly to the parting plane when the outer housing is assembled, the thermoelectric generator module being arranged obliquely to the direction of the joining force as viewed in cross-section. The desired bracing of the TEG modules in the device for exhaust gas heat utilization can thus be generated very simply upon closing of the outer housing.

A plurality of wavelike carrier walls extending parallel to each other may in particular be provided, which delimit a plurality of adjacent flow channels alternately for the exhaust gas and for the cooling agent and to which a plurality of TEG modules is fastened, in particular wherein a flow channel for hot exhaust gas which is adjoined by flow channels for the cooling agent on opposite sides is positioned centrally.

In a further embodiment, the wavelike carrier wall rests against an inner side of the outer housing via a plurality of wave tips. The closure force applied upon closing of the outer housing can thus advantageously be used to brace the carrier wall against the thermoelectric generator modules.

The outer housing preferably has two opposite large faces, the wavelike carrier walls extending along the large faces.

A mechanical force bridge composed of carrier walls, generator modules, and lamellas resting against the large faces can thereby be generated between the large faces.

Central flow channels for hot gas are preferably delimited by opposite wavelike carrier walls which adjoin each other via their wave tips and which each carry thermoelectric generator modules. Due to the fact that the flow channels for hot exhaust gas are delimited by two opposite carrier walls having TEG modules, a particularly efficient utilization of the exhaust gas heat is obtained.

Incidentally, the invention also relates to an exhaust gas module for motor vehicles, having a device for exhaust gas heat utilization as mentioned above, a bypass line for exhaust gas connected in parallel with the device, and a control or regulating element which is adapted to distribute the exhaust gas proportionally to the device and to the bypass line depending on predetermined parameters. This exhaust gas module thus permits, if necessary, a bridging of the device for exhaust gas heat utilization by a bypass line. It is then possible with little effort to avoid impairments when the internal combustion engine is started up, possible overheatings of the thermoelectric, generators and undesired high dynamic pressures in the exhaust gas line.

In one embodiment of the exhaust gas module, the device for exhaust gas heat utilization, the bypass line, and the control or regulating element are mounted in a common module carrier. A compact exhaust gas module is thus obtained, which can be integrated in new exhaust systems without difficulty, and which can be added with low expenditure in conventional exhaust systems.

Finally, the invention also relates to a manufacturing method for the device for exhaust gas heat utilization described above, the method comprising the steps of: providing a substantially flat carrier wall; fastening the at least one thermoelectric generator module to the flat carrier wall; and reshaping the flat carrier wall to form a wavelike carrier wall.

Here, the carrier wall can firstly be provided in the form of a simple, flat metal sheet to which the TEG modules can be fastened with particularly low expenditure of work and of time.

In an alternative manufacturing method for the device described above for exhaust gas heat utilization, a wavelike carrier wall is provided at the beginning. This carrier wall is usually a metal sheet having a wavelike cross-section and which was manufactured in a roll forming or extruding method, for example. The at least one thermoelectric generator module is then fastened to the wavelike carrier wall, in particular to a flat wall portion of the wavelike carrier wall.

With the methods described, compact devices for exhaust gas heat utilization can be produced with minimum expenditure, which have a good heat transfer and therefore a particularly high overall efficiency due to the bracing of the TEG modules in the outer housing.

These and other features may be best understood from the following drawings and specification.

BRIEF DESCRIPTION OF THE DRAWINGS

Further features and advantages of the invention result from the description below of preferred embodiments with reference to the drawings. These show:

FIG. 4 shows a schematic cross-section S-S of the exhaust gas module in FIG. 1 having a device for exhaust gas heat utilization according to a third embodiment of the invention.

DETAILED DESCRIPTION

Figure 1:
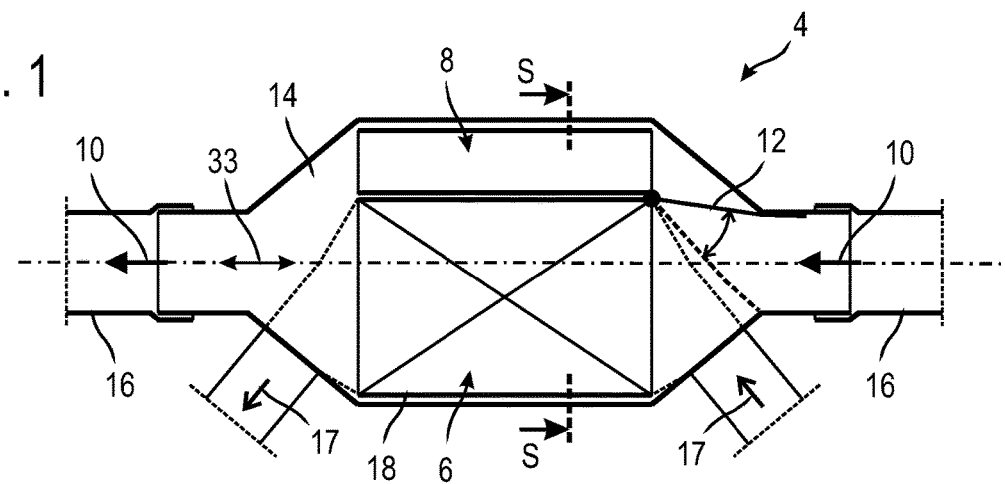
FIG. 1 shows a schematic longitudinal section through an exhaust gas module according to the invention.

FIG. 1 shows a longitudinal section through an exhaust gas module 4 for motor vehicles, having a device 6 for exhaust gas heat utilization, a bypass line 8 for exhaust gas 10 connected in parallel with the device 6, and a control or regulating element 12 which is adapted to distribute the exhaust gas 10 proportionally to the device 6 and to the bypass line 8 depending on predetermined parameters. Since the device 6 for exhaust gas heat utilization, the bypass line 8, and the control or regulating element 12 formed as a control flap are mounted in a common module carrier 14, the exhaust gas module 4 can be manufactured as a compact, prefabricated assembly and mounted with little effort in an exhaust gas line 16 of an internal combustion engine.

The exhaust gas module 4, specifically the device 6 for exhaust gas heat utilization of the exhaust gas module 4 is further connected to a cooling circuit in which a cooling agent 17 circulates. Water is preferably used as the cooling agent 17.

The device 6 for exhaust gas heat utilization is in particular connected to an engine cooling circuit of the motor vehicle. However, alternatively, an air-conditioning circuit of the motor vehicle may be used, or a separate cooling circuit for the exhaust gas module 4 may be provided.

Figure 2:
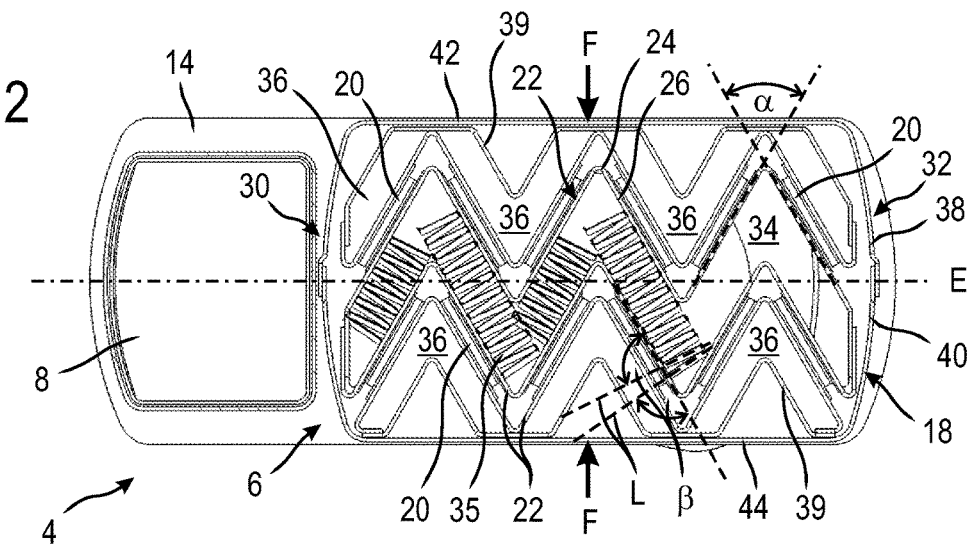
FIG. 2 shows a schematic cross-section S-S of the exhaust gas module in FIG. 1 having a device for exhaust gas heat utilization according to a first embodiment of the invention.
Figure 3:
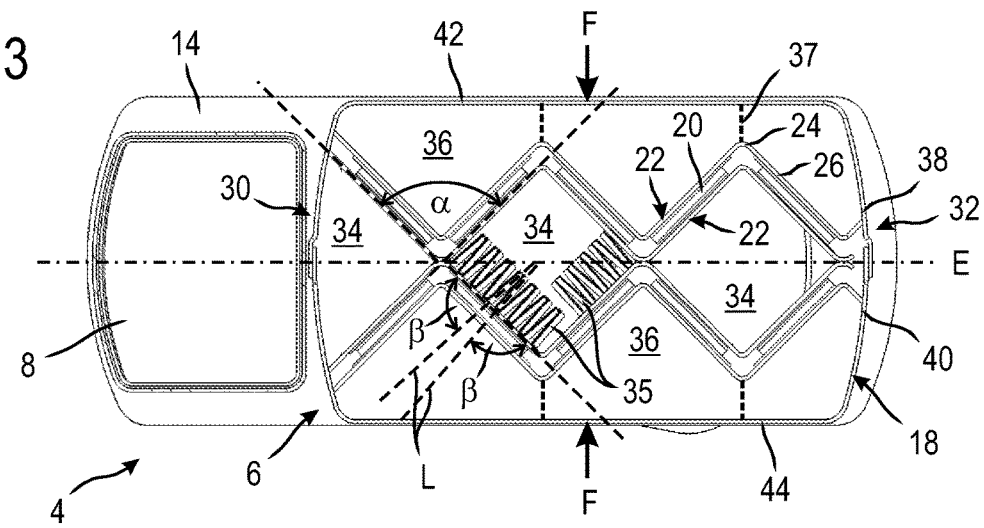
FIG. 3 shows a schematic cross-section S-S of the exhaust gas module in FIG. 1 having a device for exhaust gas heat utilization according to a second embodiment of the invention.

FIGS. 2 to 4 each show a cross-section S-S of the exhaust gas module 4 according to FIG. 1. The exhaust gas modules 4 differ from each other only in the device 6 for exhaust gas heat utilization respectively used. FIG. 2 shows a first embodiment, FIG. 3 shows a second embodiment, and FIG. 4 shows a third embodiment of the device 6.

The features of the device 6 for exhaust gas heat utilization described below generally relate to all illustrated embodiments, provided that no specialties of a specific embodiment are being explained with explicit reference to the corresponding figure.

FIGS. 2 to 4 each show a device 6 for exhaust gas heat utilization in internal combustion engines of motor vehicles, having an outer housing 18 through which exhaust gas can flow and a plurality of thermoelectric generator modules (TEG modules) 20 received in the outer housing 18, the TEG modules 20 being fastened to a wavelike carrier wall 22, in particular being bonded or soldered to the carrier wall 22.

In the following, a TEG module 20 is to be understood as a known, prefabricated assembly comprising interconnected thermoelectric elements made of thermoelectric materials, opposite cover plates, preferably made of ceramics and defining a "hot side" and a "cold side", and electric connections for tapping the electric energy produced.

In the embodiments illustrated, the wavelike carrier wall 22 has bent wall portions 24 and flat wall portions 26, the TEG modules 20 being configured as thin, cuboidal plates and each resting over an area against one of the flat wall portions 26.

The adjacent flat wall portions 26 of the wavelike carrier wall 22 are preferably oriented at an angle α of $0° \leq \alpha \leq 120°$, particularly preferably of $45° \leq \alpha \leq 90°$ with respect to each other.

The embodiments illustrated in FIGS. 2 to 4 of the device 6 for exhaust gas heat utilization differ from each other in the angle α, the first embodiment having an angle of $\alpha \approx 60°$ (see FIG. 2), the second embodiment having an angle of $\alpha \approx 90°$ (see FIG. 3), and the third embodiment having an angle of $\alpha \approx 0°$ (see FIG. 4).

In the third embodiment with $\alpha \approx 0°$, a wavelike carrier wall 22 having an approximately U-shaped wave cross-section is obtained. The TEG modules 20 are each fastened to the largely parallel legs 28 of the U rather than to the connecting web 29 between the legs 28 of the U (see FIG. 4).

Apart from the special case $\alpha \approx 0°$, wavelike carrier walls 22 having a V-shaped wave cross-section are obtained, for which reason a concertina-like "zigzag shape" of the wavelike carrier wall 22 is produced (see FIGS. 2 and 3).

Alternatively, substantially sinusoidal wave cross-sections are also conceivable. In this case, the TEG modules 20 should have a curvature which is exactly adapted to the sinusoidal shape or have a certain flexibility to be able to produce the surface contact with the carrier wall 22 which is necessary for a good transfer of heat.

In the example embodiments according to FIGS. 2 to 4, the TEG modules 20 are each held between two wavelike carrier walls 22, the carrier walls 22 being made of stable metal sheets, in particular of sheet-steel panels. Alternatively, it is also conceivable that a carrier wall 22 made of a stable metal sheet is replaced with a flexible metal foil. In comparison with the metal sheet, the metal foil distinguishes itself by a considerably lower thickness and therefore by a considerably lower weight, the ratio between the metal sheet thickness and the foil thickness being at least 10:1, preferable 25:1. Incidentally, the metal foil has no inherent stiffness.

In the illustrated embodiments of the device 6 for exhaust gas heat utilization, the outer housing 18 has a housing cross-section, the carrier wall 22 extending in a wavelike manner and in one piece substantially from one cross-sectional edge 30 to an opposite cross-sectional edge 32. The housing cross-section is here perpendicular to a longitudinal direction 33 of the exhaust gas module 4 which substantially also corresponds to a flow direction of the exhaust gas 10. Depending on the embodiment of the device 6, the wavelike carrier wall 22 is connected with the cross-sectional edge 30, 32, for example soldered or welded thereto (see FIG. 3), or merely adjoins the cross-sectional edge 30, 32, the carrier wall 22 contacting the cross-sectional edge 30, 32 (see FIG. 4), or being spaced apart from the cross-sectional edge 30, 32 (see FIG. 2).

According to FIGS. 2 to 4, heat conducting lamellas 35 adjoin the carrier wall 22 on a face of the carrier wall 22 facing away from the TEG modules 20. The lamellas 35 are clamped between two wavelike carrier walls 22 and are adapted to be firmly connected to at least one of the two carrier walls 22. In the present embodiment, the lamellas 35 are, for example, soldered on one side to the wavelike carrier wall 22.

For reasons of simple manufacture and mounting, the cross-section of the heat conducting lamellas 35 is preferably configured as a trapezoidal sheet or as a metal sheet bent in a concertina-like manner (see FIGS. 2 to 4). In addition, at least parts of the individual lamellas 35 can also be profiled, in particular be undulated in the longitudinal direction 33.

The lamellas 35 usually extend in a flow channel 34, in which the exhaust gas 10 flows around them. They thus provide for a better transfer of heat between the exhaust gas 10 and the wavelike carrier wall 22.

In the second embodiment according to FIG. 3, the lamellas 35 exclusively conduce to a better transfer of heat, while in the other illustrated embodiments, they also contribute to a desired bracing of the TEG modules 20 in the outer housing 18 of the device 6 for exhaust gas heat utilization.

Each lamella 35 determines a lamella plane L. The lamella planes L of the lamellas 35 adjoin a flat wall portion 26, each forming, along with the flat wall portion 26, an angle β of 30°<β<90, preferably of 60°<β<88°. In this angular range, both a good normal force transfer between the carrier walls 22 adjoining the lamellas 35 is possible and a certain elasticity in the device 6 for exhaust gas heat utilization is given. One the one hand, a high contact pressure between the TEG modules 20 and the carrier walls 22 can thus be obtained, on the other hand, a mechanical overstressing for example due to dimensional tolerances or thermal expansions of the involved components is largely avoided.

In particular in the embodiment according to FIG. 2, a particularly advantageous elastic behavior of the device 6 is obtained, as the angle α can increase due to the clearance between the carrier wall 22 and the outer housing 18, and/or the angle β can become smaller in case of an appropriate fastening between the carrier wall 22 and the lamellas 35, if excessive forces, for example excessive joining forces F are produced. As a consequence of these possibilities of deformation within the device 6 for exhaust gas heat utilization, a mechanical overstressing can reliably be avoided.

At least one flow channel 34 for hot exhaust gas 10, and at least one flow channel 36 for the cooling agent 17 respectively extend in the longitudinal direction 33 through the outer housing 18. The TEG modules 20 are associated on opposite sides on the one hand with the exhaust gas 10 and, on the other hand, with the cooling agent 17.

The at least one flow channel 34 for exhaust gas 10, just as the at least one flow channel 36 for cooling agent 17 is realized in a fluid-tight manner in the longitudinal direction 33. In case a plurality of flow channels 34 for exhaust gas is provided, a fluid-tight configuration of flow channels 34 adjoining each other is not necessary. A fluid exchange between the flow channels 34 for exhaust gas is maybe even desired in order to obtain a uniform flow distribution over the entire cross-section of the individual flow channels 34. This also applies in case several flow channels 36 for the cooling agent 17 are provided.

In all example embodiments shown, the wavelike carrier wall 22, specifically the face of the wavelike carrier wall 22 facing away from the TEG module 20, is part of a flow channel 34 for the exhaust gas 10 or of a flow channel 36 for the cooling agent 17.

In the first embodiment of the device 6 for exhaust gas heat utilization, two adjacent wavelike carrier walls 22 define a flow channel 34 for the exhaust gas 10, the cross-section of the resulting flow channel 34 also being realized in a wavelike manner. Altogether, a plurality of wavelike carrier walls 22 which extend parallel to each other and delimit a plurality of adjacent flow channels 34, 36 alternately for exhaust gas 10 and for cooling agent 17 is provided, a plurality of TEG modules 20 adjoining the carrier walls 22 and being in particular fastened thereto. As shown in FIG. 2, a flow channel 34 for hot exhaust gas 10 is positioned in the center, flow channels 36 for cooling agent 17 adjoining this flow channel 34 on opposite sides. Apart from carrier metal sheets 22 for TEG modules 20, channel metal sheets 39 are additionally provided to form these flow channels 36. As the flow channel 34 for exhaust gas 10 is delimited by two carrier walls 22 having TEG modules 20, the exhaust gas heat is in this case used in a particularly efficient manner. Due to the arrangement of the flow channels 36 close to the housing, the outer housing 18 does not reach undesired high temperatures during operation of the device 6, either.

Furthermore, in the first embodiment, several "wave tips", i.e. bent wall portions 24 of the wavelike carrier wall 22 rest on an inner side of the outer housing 18. This increases the stability of the device 6 and provides for a good bracing within the device 6, the TEG modules 20 being pressed over an area against the carrier walls 22.

According to the second embodiment of the device 6 for exhaust gas heat utilization, two adjacent wavelike carrier walls 22 define in the region of the cross-sectional edge 30 along with the outer housing 18 a flow channel 34 for the exhaust gas 10, while further towards the cross-sectional center, only the two adjacent wavelike carrier walls 22 define further flow channels 34 for exhaust gas 10.

The central flow channels 34 for hot exhaust gas 10 are thus delimited by opposite wavelike carrier walls 22 which adjoin each other with their "wave tips", i.e. their bent wall portions 24, and each carry TEG modules 20. Since the flow channels 34 for hot exhaust gas 10 are thus delimited by two opposite carrier walls 22 having TEG modules 20, a particularly efficient utilization of the exhaust gas heat is achieved.

In order to increase the stability of the device 6 according to FIG. 3 and to obtain a higher contact pressure between the TEG modules 20 and the carrier walls 22, supporting elements 37 formed as perforated panels can for example be provided, via which the wavelike carrier walls 22 rest against the outer housing 18.

In all illustrated embodiments, the outer housing 18 is composed of two pieces and has a parting plane E at which two half shells 38, 40 are connected with each other to form the outer housing 18. When the outer housing 18 is assembled, the two half shells 38, 40 are acted upon by a joining force F which is oriented substantially perpendicularly to the parting plane E, the TEG modules 20 being arranged obliquely to the direction of the joining force F as viewed in cross-section.

The outer housing 18 has opposite large faces 42, 44 which in the example embodiments according to FIGS. 2 and 3 extend substantially parallel to the parting plane E, the carrier walls 22 running along the large faces 42, 44.

In FIG. 2, a mechanical force bridge composed of several wavelike carrier walls 22, TEG modules 20, and lamellas 35 can thus be formed between the large faces 42, 44.

In FIG. 3, the lamellas 35 are not part of the mechanical force bridge, which in this case is composed of several wavelike carrier walls 22, TEG modules 20, and supporting elements 37.

In the example embodiment according to FIG. 4, no mechanical force bridge can be formed between the large faces 42, 44 of the outer housing since the forces in the region of the flow channels 36 for the cooling agent 17 can be transmitted only by the elastic deflection of the wavelike carrier walls 22. Therefore, the device 6 according to FIG. 4 is considerably "softer" in the direction of the joining force F than the devices 6 according to FIGS. 2 and 3.

In order to achieve a higher bracing in the outer housing 18, a mechanical force bridge may also be realized in the device 6 according to FIG. 4 by providing, for example, analogously to the flow channels 34 for the exhaust gas 10, lamellas 35 also in the flow channels 36 for the cooling agent 17. For a better transfer of heat, it is of course also possible to provide lamellas 35 in the flow channels 36 of the other embodiments.

Concerning the manufacture of the device 6 for exhaust gas heat utilization, the following method is particularly advantageous:

Firstly, a substantially flat carrier wall is provided, this carrier wall being a simple, flat metal sheet. The TEG modules 20 are then fastened, in particular bonded or soldered to the flat carrier wall. Then the flat carrier wall is reshaped to a wavelike carrier wall 22 in a further method step. In this case, the attachment of the TEG modules 20 can be performed with particularly little effort. Alternatively, a method variant is however also conceivable, in which a wavelike carrier wall 22 is provided right from the beginning, the carrier wall 22 being for example a metal sheet formed in a roll forming method or in a extruding method. The TEG modules 20 are then fastened to the wavelike carrier wall 22. The expenditure for fastening the TEG modules 20 is here slightly higher, but the final reshaping of the assembly made of carrier wall 22 and TEG modules 20 according to the method variant mentioned above is eliminated.

A further wavelike carrier wall 22 preformed, for example, in a roll forming or extruding method, or a flexible metal foil is then applied onto the TEG modules 20 such that the TEG modules 20 are arranged between two wavelike carrier walls 22, or between a wavelike carrier wall 22 and the flexible metal foil and rest over an area there against.

In a further method step, the optional lamellas 35 are mounted in the flow channel 34 for the exhaust gas 10 and/or in the flow channel for the cooling agent 17.

The prefabricated assembly composed of TEG modules 20, wavelike carrier walls 22 and optional lamellas 35 is then placed in the outer housing 18 and, if necessary, connected with the outer housing 18 (in a sealing manner).

To finally brace the prefabricated assembly within the outer housing 18, the half shells 38, 40 of the outer housing 18 are acted upon with the joining force F and are connected, in particular welded or soldered to each other. After completion of the device 6 for exhaust gas heat utilization, the contact pressure produced by the joining force F within the outer housing 18 can amount to up to 14 bar.

Although an embodiment of this invention has been disclosed, a worker of ordinary skill in this art would recognize that certain modifications would come within the scope of this invention. For that reason, the following claims should be studied to determine the true scope and content of this invention.

The invention claimed is:

1. A device for exhaust gas heat utilization in internal combustion engines of motor vehicles comprising:
   an outer housing through which exhaust gas can flow, the outer housing having a longitudinal direction corresponding to a direction of an exhaust gas flow;
   at least one exhaust gas flow channel extending through the outer housing in the longitudinal direction and at least one cooling flow channel extending through the outer housing in the longitudinal direction, the at least one exhaust gas flow channel configured to conduct hot exhaust gases and the at least one cooling flow channel being configured to conduct a cooling agent;
   a plurality of wave carrier walls received within and surrounded by the outer housing, wherein each wave carrier wall has a wave shaped cross-section; and
   at least one thermoelectric generator module received in the outer housing and fastened onto the plurality of wave carrier walls, the at least one thermoelectric generator module being configured as a thin cuboidal plate and comprising interconnected thermoelectric elements, opposite cover plates, and electric connections for tapping electric energy;
   wherein the plurality of wave carrier walls comprise at least a first wave carrier wall that delimits the at least one exhaust gas flow channel and a second wave carrier wall extending parallel and adjacent to the first wave carrier wall, and wherein the second wave carrier wall delimits the at least one cooling flow channel;
   wherein the at least one thermoelectric generator module is arranged outside the at least one exhaust gas and cooling flow channels and is held directly between the first and second wave carrier walls;
   wherein each wave carrier wall comprises bent wall portions and flat wall portions, each thermoelectric generator module being in direct contact with exactly one of the flat wall portions of the first wave carrier wall and being in direct contact with exactly one of the flat wall portions of the second wave carrier wall; and
   wherein the second wave carrier wall extends parallel and adjacent to the first wave carrier wall over the complete extension of the first wave carrier wall.

2. The device according to claim 1, wherein the outer housing has a housing cross-section extending perpendicular to the longitudinal direction of the outer housing and the direction of the exhaust gas flow, the longitudinal direction defining a longitudinal axis, and wherein the housing cross-section extends from one cross-sectional edge on one side of the longitudinal axis to an opposite cross-sectional edge on an opposite side of the longitudinal axis, with each of the wave carrier walls extending in a wave manner and in one piece substantially from the one cross-sectional edge to the opposite cross-sectional edge of the housing cross-section.

3. The device according to claim 2, wherein the plurality of wave carrier walls have a V-shaped wave cross-section.

4. The device according to claim 1, wherein adjacent flat wall portions of each wave carrier wall is oriented at an angle ($\alpha$) of $0° \leq \alpha \leq 120°$ with respect to each other.

5. The device according to claim 1, wherein on a face of a wave carrier wall facing away from the at least one thermoelectric generator module, heat conducting lamellas adjoin the wave carrier wall, with the heat conducting lamellas being clamped directly between two wave carrier walls and being located within the at least one exhaust gas flow channel.

6. The device according to claim 5, wherein the heat conducting lamellas are connected with at least one of the wave carrier walls by an intermaterial bond.

7. The device according to claim 5, wherein the heat conducting lamellas are made of a metal sheet bent to include a plurality of bends that are in an overlapping relationship with each other to form a zig-zag shape.

8. The device according to claim 5, wherein the plurality of wave carrier walls have flat wall portions, and in that each heat conducting lamella determines a lamella plane, the lamella planes of the heat conducting lamellas adjoining a flat wall portion respectively forming along with the flat wall portion an angle (β) of 30°<β<90°.

9. The device according to claim 1, wherein the at least one thermoelectric generator module has a first face in direct contact with the first wave carrier wall and having a second face, opposite the first face, in direct contact with the second wave carrier wall.

10. The device according to claim 1, wherein the at least one exhaust gas and cooling flow channels have a wave cross-section.

11. The device according to claim 1, wherein the outer housing is composed of two half shells and has a parting plane at which the two half shells are connected with each other to form the outer housing.

12. The device according to claim 11, wherein the two half shells are acted upon by a joining force when the outer housing is assembled, the joining force being directed substantially perpendicularly to the parting plane, the at least one thermoelectric generator module being arranged obliquely to the direction of the joining force as viewed in cross-section.

13. The device according to claim 1, wherein the plurality of wave carrier walls extend parallel to each other to delimit a plurality of adjacent flow channels alternately comprising one exhaust gas flow channel adjacent one cooling flow channel, and wherein the at least one thermoelectric generator module comprises a plurality of thermoelectric generator modules that are fastened between the at least one exhaust gas and cooling flow channels, and wherein one exhaust gas flow channel has one side adjoined by one cooling flow channel and an opposite side adjoined by another cooling flow channel.

14. The device according to claim 8, wherein at least one of the wave carrier walls has flat wall portions, and in that each heat conducting lamella determines a lamella plane, the lamella planes of the heat conducting lamellas adjoining a flat wall portion respectively forming along with the flat wall portion an angle (β) of 60°<β<88°.

15. The device according to claim 1, wherein one of the opposite cover plates comprises a hot side and the other of the opposite cover plates comprises a cold side.

16. The device according to claim 1, wherein the opposite cover plates lie flat against, and in direct abutting contact with, the flat wall portions of the plurality of wave carrier walls.

17. The device according to claim 1, wherein the plurality of wave carrier walls are held fixed to the outer housing.

18. The device according to claim 1, wherein the bent wall portions and flat wall portions alternate with one another to form a wave shape.

19. The device according to claim 1, wherein the thin cuboidal plate has a first flat plate surface that rests in direct abutting contact with a corresponding flat area of the one of the flat wall portions of the first wave carrier wall and a second flat plate surface that that rests in direct abutting contact with a corresponding flat area of the one of the flat wall portions of the second wave carrier wall.

20. The exhaust gas module according to claim 1, wherein the flat wall portion of the first wave carrier wall and the flat wall portion of the second wave carrier wall have at least the dimensions of the opposite cover plates of the at least one thermoelectric generator module in a contact area where the at least one thermoelectric generator module is in contact with the flat wall portions.

21. The exhaust gas module according to claim 1, wherein the opposite cover plates of the at least one thermoelectric generator module are flat.

* * * * *